United States Patent
Bang et al.

(10) Patent No.: US 6,771,681 B2
(45) Date of Patent: Aug. 3, 2004

(54) DISTRIBUTED FEEDBACK SEMICONDUCTOR LASER

(75) Inventors: Dong-Soo Bang, Seoul (KR);
Dong-Hoon Jang, Suwon-shi (KR);
Jong-In Shim, Ansan-shi (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 10/190,214

(22) Filed: Jul. 5, 2002

(65) Prior Publication Data

US 2003/0072346 A1 Apr. 17, 2003

(30) Foreign Application Priority Data

Oct. 12, 2001 (KR) .......................................... 2001-62881

(51) Int. Cl.[7] .............................................. H01S 3/085
(52) U.S. Cl. .............................. 372/46; 372/45; 372/43; 372/46
(58) Field of Search .............................. 372/96, 27, 19, 372/44, 50; 438/32

(56) References Cited

U.S. PATENT DOCUMENTS

| | | | | |
|---|---|---|---|---|
| 4,932,034 A | * | 6/1990 | Usami et al. ................. | 372/96 |
| 5,586,131 A | * | 12/1996 | Ono et al. ..................... | 372/19 |
| 5,878,066 A | * | 3/1999 | Mizutani et al. .............. | 372/27 |
| 6,043,104 A | * | 3/2000 | Uchida et al. ................ | 438/32 |
| 6,075,799 A | * | 6/2000 | Uchida et al. ................ | 372/27 |
| 6,091,745 A | * | 7/2000 | Nitta ............................. | 372/27 |
| 6,111,906 A | * | 8/2000 | Muroya ........................ | 372/96 |
| 6,175,581 B1 | * | 1/2001 | Sato ............................. | 372/44 |
| 6,252,895 B1 | * | 6/2001 | Nitta et al. ................... | 372/50 |
| 6,337,868 B1 | * | 1/2002 | Mizutani ..................... | 372/27 |

* cited by examiner

Primary Examiner—Don Wong
Assistant Examiner—Dung T. Nguyen
(74) Attorney, Agent, or Firm—Cha & Reiter, LLC.

(57) ABSTRACT

A distributed feedback semiconductor laser and a method of manufacture includes first and second clad layers having predetermined refractive indexes that are formed on a semiconductor substrate. A guide layer propagates light between the first and second clad layers. An oscillating clad layer oscillates light at a predetermined wavelength and an amplifying clad layer amplifies the light with a predetermined gain between the first clad layer and the guide layer. The distributed feedback semiconductor laser is divided into a laser oscillation section including the oscillating clad layer and a laser amplification section including the amplifying active layer. First and second gratings are formed on the lower surface of the guide layer in the laser oscillation section and in the laser amplification section, respectively.

19 Claims, 4 Drawing Sheets

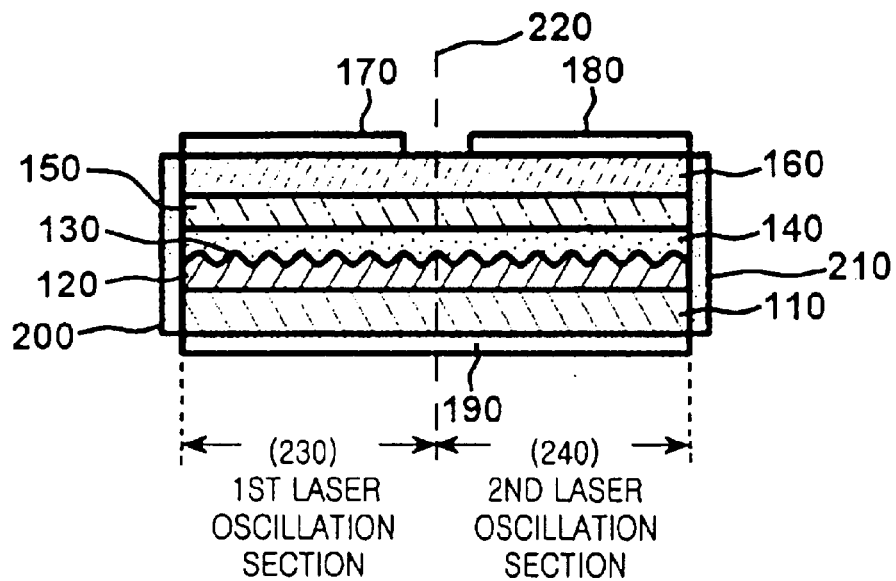
FIG. 1 [prior art]
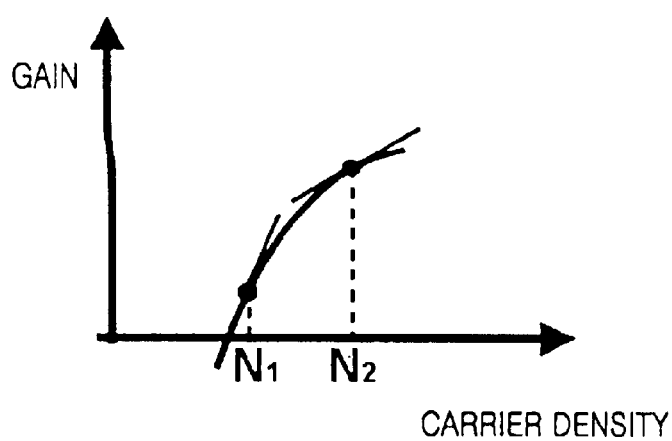
FIG. 2 [prior art]

DISTRIBUTED FEEDBACK SEMICONDUCTOR LASER

CLAIM OF PRIORITY

This application makes reference to and claims all benefits accruing under 35 U.S.C. Section 119 from an application entitled "Distributed Feedback Semiconductor Laser" filed in the Korean Industrial Property Office on Oct. 12, 2001 and assigned Serial No. 2001-62881, the contents of which are hereby incorporated by reference.

BACKGROUND OF THE INVENTION

1. Field of the Invention

The present invention relates generally to semiconductor lasers. More particularly, the present invention relates to a distributed feedback semiconductor laser.

2. Description of the Related Art

In general, a distributed feedback semiconductor laser is formed on a semiconductor substrate so as to have a guide layer that serves as a light traveling path. Gratings are formed on the lower surface of the guide layer.

FIG. 1 is a sectional view of a conventional distributed feedback semiconductor laser. Referring to FIG. 1, the distributed feedback semiconductor laser includes a semiconductor substrate 110, first and second clad layers 120 and 160, a guide layer 140, an active layer 150, first and second upper electrodes 170 and 180, a lower electrode 190, and first and second reflective layers 200 and 210. The distributed feedback semiconductor laser is divided into a first laser oscillation section 230 and a second laser oscillation section 240 with respect to a central line 220.

The first clad layer 120 has gratings 130 on its upper surface. The gratings 130 have a predetermined period and a distributed feedback wavelength is determined by the grating period. The active layer 150 is formed in a multiple quantum well structure and the distributed feedback semiconductor laser has a 2-electrode structure. During DC operation, when predetermined currents $I_1$ and $I_2$ are applied to the first and second upper electrodes 170 and 180, respectively, a predetermined gain is achieved from the active layer 150, and light with a distributed feedback wavelength is oscillated as in a conventional 1-electrode distributed feedback semiconductor laser. During AC operation, when the predetermined current $I_1$ and a modulated current $(I1+\Delta I_2)$ are applied to the first and second upper electrodes 170 and 180, respectively, a gain decrease at a low current level is compensated for by a gain generated by application of the current $I_1$, thus obtaining a derivative gain at or above a predetermined level.

FIG. 2 is a carrier density-gain graph in a distributed feedback semiconductor laser. FIG. 2 graphically illustrates that the gain increases with a carrier density, and a derivative gain, which is defined as a ratio of a fine carrier density increment to a fine gain increment, decreases with the carrier density.

However, the conventional distributed feedback semiconductor laser experiences a great loss of light in the guide layer 140 and the active layer 150. Therefore, about $10^{18}$ $[cm^{-3}]$ or more carriers are required in the active layer 150 in order to oscillate the distributed feedback semiconductor laser. Meanwhile, as the carrier density increases, the derivative gain decreases and the amount of light loss increases. In FIG. 2, $N_2$ denotes the carrier density of the active layer 150 and a derivative gain-carrier density curve at $N_2$ is illustrated. If the level of the input current is increased to compensate for the decrease of the derivative gain, a non-radiative recombination rate increases. The resulting heat emission deteriorates the temperature characteristics of the distributed feedback semiconductor laser, making its operation at high temperature impossible.

Moreover, high modulation of the distributed feedback semiconductor laser by a high-level current worsens chirping due to carrier fluctuation and thus, limits the frequency bandwidth. Consequently, the transmission characteristics of the distributed feedback semiconductor laser deteriorate.

SUMMARY OF THE INVENTION

It is, therefore, an object of the present invention to provide a distributed feedback semiconductor laser that maximizes the derivative gain.

The above and other objects are achieved by providing a distributed feedback semiconductor laser. In the distributed feedback semiconductor laser, first and second clad layers having predetermined refractive indexes are formed on a semiconductor substrate. A guide layer propagates light between the first and second clad layers. An oscillating clad layer oscillates light at a predetermined wavelength and an amplifying clad layer amplifies the light with a predetermined gain between the first clad layer and the guide layer. The distributed feedback semiconductor laser is divided into a laser oscillation section including the oscillating clad layer and a laser amplification section including the amplifying active layer. First and second gratings are formed on the lower surface of the guide layer in the laser oscillation section and in the laser amplification section, respectively.

BRIEF DESCRIPTION OF THE DRAWINGS

The above and other objects, features and advantages of the present invention will become more apparent from the following detailed description when taken in conjunction with the accompanying drawings in which:

FIG. 1 is a sectional view of a conventional distributed feedback semiconductor laser;

FIG. 2 is a carrier density-gain graph in a distributed feedback semiconductor laser;

DETAILED DESCRIPTION OF THE PREFERRED EMBODIMENT

A preferred embodiment of the present invention will be described hereinbelow with reference to the accompanying drawings. In the following description, well-known functions or constructions are not described in detail since they would obscure the invention in unnecessary detail.

Figure 3:
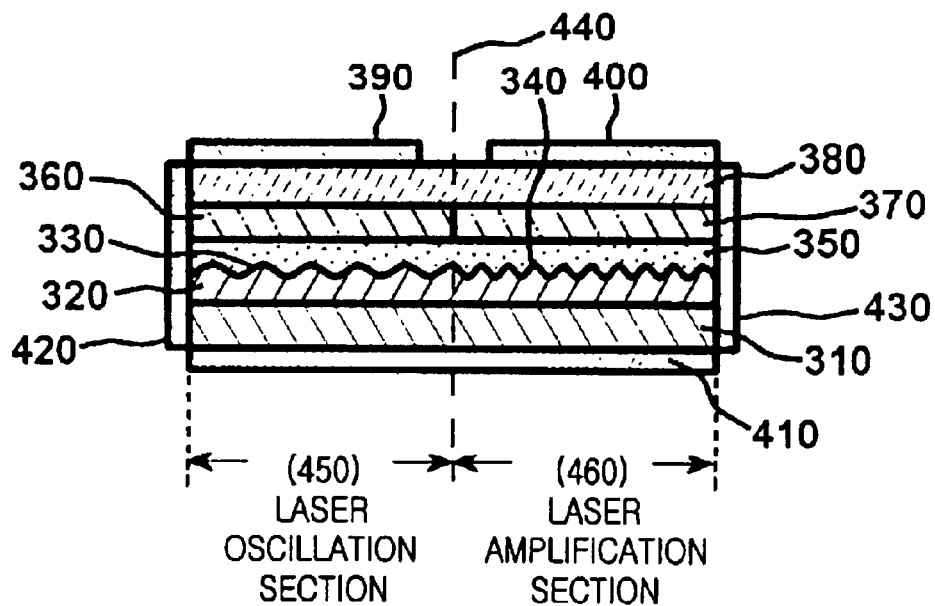
FIG. 3 is a sectional view of a distributed feedback semiconductor laser according to a preferred embodiment of the present invention.

FIG. 3 provides a cross-sectional view of a distributed feedback semiconductor laser according to a preferred embodiment of the present invention. Referring to FIG. 3, the distributed feedback semiconductor laser includes a semiconductor substrate 310, first and second clad layers 320 and 380, a guide layer 350, an oscillating active layer 360, an amplifying active layer 370, first and second upper electrodes 390 and 400, a lower electrode 410, and first and second reflective layers 420 and 430. The distributed feedback semiconductor laser is divided into a laser oscillation section 450 and a laser amplification section 460 with respect to a central line 440.

First gratings 330 are formed in the laser oscillation section 450. The first gratings 330 have a predetermined first grating period, which determines a first distributed feedback wavelength. Second gratings 340 are formed in a predetermined second grating period in the laser amplification section 460. Similarly, a second distributed feedback wavelength is determined by the second grating period. The first distributed feedback wavelength is longer than the second distributed feedback wavelength. The difference in the distributed feedback wavelengths is due to the setting of the first grating period longer than the second grating period. A gain wavelength, that is, a wavelength at which a gain peak value is observed in the amplifying active layer 370 is set to be approximate to the first distributed feedback wavelength by adopting an appropriate structure for the amplifying active layer 370.

The gain and carrier density of the laser amplification section 460 are not varied with external incident light. Therefore, if light that is generated from the laser oscillation section 450 is oscillated through the laser amplification section 460, the distributed feedback semiconductor laser is biased to provide a predetermined gain. This predetermined gain implies that a small number of carriers are enough in a gain region of the laser amplification section 460 to oscillate the distributed feedback semiconductor laser. Therefore, the carrier density of the distributed feedback semiconductor laser can be controlled to dramatically low levels.

Referring to FIG. 2, a derivative gain line at the carrier density $N_1$ is illustrated for the distributed feedback semiconductor laser. As noted from FIG. 2, the distributed feedback semiconductor laser according to the present invention has a lower carrier density $N_1$ and a higher derivative gain than the conventional distributed feedback semiconductor laser.

FIGS. 4 to 7 are sectional views sequentially illustrating a method of fabricating the distributed feedback semiconductor laser illustrated in FIG. 3.

Figure 4:
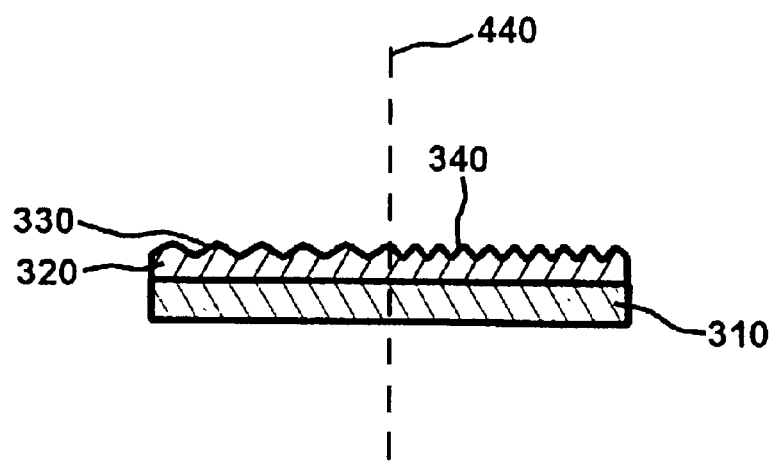
FIGS. 4 to 7 are sectional views sequentially illustrating a method of fabricating the distributed feedback semiconductor laser illustrated in FIG. 3.

Referring to FIG. 4, the first clad layer 320 is formed of an n-type InP on the n-type InP semiconductor substrate 310, and the first gratings 330 having the first grating period are formed by, for example, photolithography on the first clad layer 320 in the laser oscillation section 450. After a photoresist layer (not shown) is deposited on the first clad layer 320, it is exposed using a phase mask (not shown) with the first grating period, and then developed. Then, a photoresist mask (not shown) having a first-period pattern is obtained. Using the photoresist mask, the first gratings 330 are formed on the first clad layer 320. In the same manner, the second gratings 340 having the second grating period shorter than the first grating period are formed on the first clad layer 320 in the laser amplification section 460.

Figure 5:
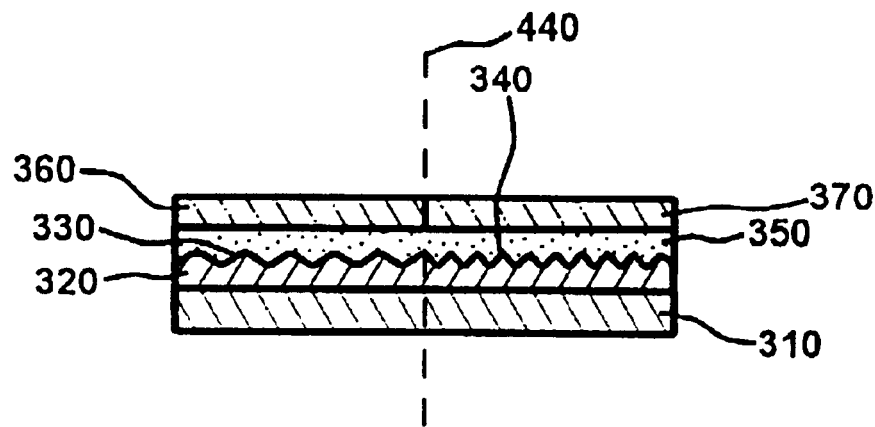

Referring to FIG. 5, the oscillating active layer 360 is formed of InGaAs/InGaAsP on the guide layer 330 in the laser oscillation section 450, and the amplifying active layer 370 is formed of InGaAs/InGaAsP on the guide layer 350 in the laser amplifying section 460. The gain wavelength of the laser amplification section 460 is set to be approximate to the distributed feedback wavelength of the first gratings 330, and the oscillating active layer 360 is as thick as the amplifying active layer 370.

Figure 6:
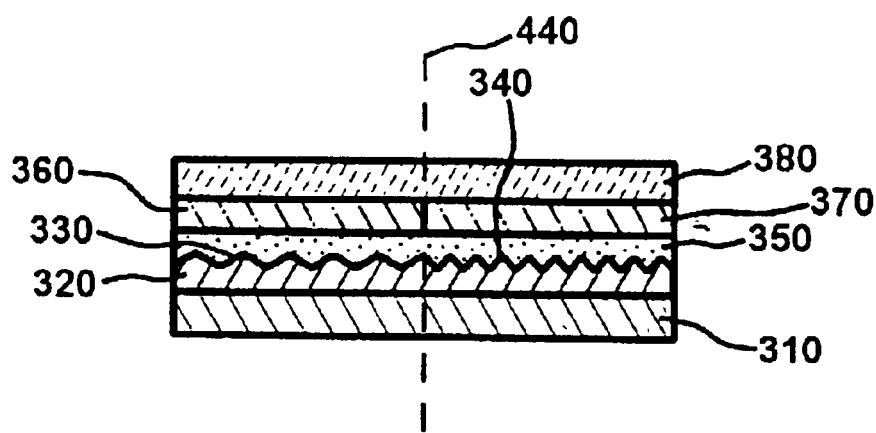

Referring to FIG. 6, the second clad layer 380 is formed of a p-type InP on the oscillating active layer 360 and the amplifying active layer 370. The refractive index of the second clad layer 380 is set to be equal to that of the first clad layer 320. The first and second clad layers 320 and 380 function to prevent light propagated in the guide layer from being transmitted outside due to a refractive index difference.

Figure 7:
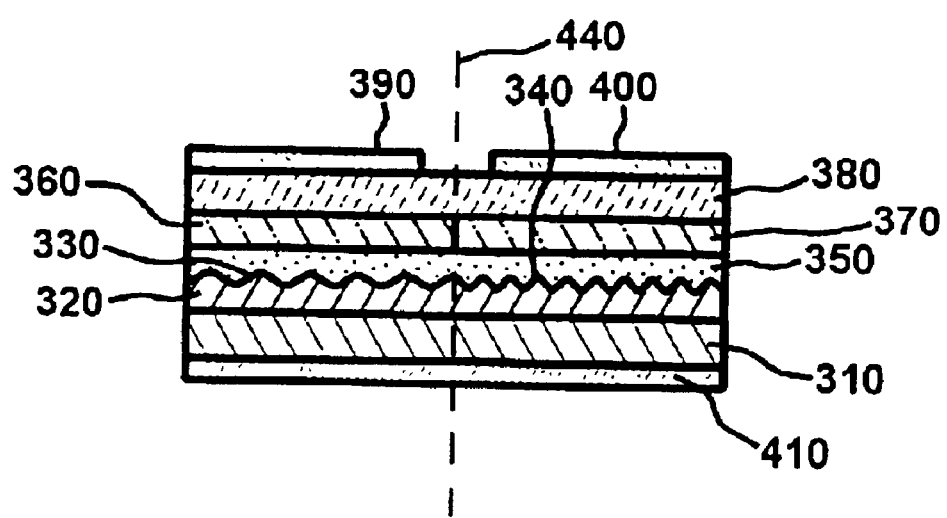

Referring to FIG. 7, the first and second upper electrodes 390 and 400 are formed of Ti/Pt/AL on the second clad layer 380 so as to be electrically isolated from each other. A predetermined current is applied to the laser oscillation section 450 via the first upper electrode 390, and another predetermined current is applied to the laser amplification section 460 via the second upper electrode 400. The lower electrode 410 is formed of AuGe/Ni/Au under the semiconductor substrate 310.

Referring to FIG. 3, the first reflective layer 420 is formed on the exposed side surface of the laser oscillation section 450 to have a reflectance approximate to 0. The second reflective layer 430 is formed on the exposed side surface of the laser amplification section 460 to have a reflectance higher than 0.

The distributed feedback semiconductor laser illustrated in FIG. 3 is operable with a small number of carriers because an amount of gain sufficient for oscillation can be obtained from the laser amplification section 460. Although the laser output power may vary according to current changes in AC operation, there is no change in carrier density. The result is stable operation without any frequency change, which prevents chirping from worsening due to a change in carrier density. Due to the low carrier density in the laser oscillation section 450, the distributed feedback semiconductor laser exhibits stable temperature characteristics and can be modulated at high speed.

As described above, the distributed feedback semiconductor laser advantageously minimizes its carrier density and thus maximizes a derivative gain by integrating a laser amplification section and a laser oscillation section with no changes in carrier density on a single semiconductor substrate.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A distributed feedback semiconductor laser comprising:
   a semiconductor substrate;
   first and second clad layers formed on the semiconductor substrate, said first and second clad layers having predetermined refractive indexes;
   a guide layer arranged between the first and second clad layers, for propagating light;
   an oscillating act active layer arranged between the second clad layer and the guide layer, for oscillating light at a predetermined wavelength; and
   an amplifying active layer between the second clad layer and the guide layer, for amplifying the light with a predetermined gain;
   wherein a laser oscillation section comprises a predetermined portion of the distributed feedback semiconductor laser including the oscillating active layer, and a laser amplification section comprises a remaining portion of the distributed feedback semiconductor laser including the amplifying active layers;
   wherein first gratings are formed on a lower surface of the guide layer in the laser oscillation section;

wherein second gratings are formed on a lower surface of the guide layer in the laser amplification section; and wherein a period of the first gratings is longer than a period of the second gratings and a gain wave length of the amplifying active layer is approximate to a distributed feedback wavelength of the first gratings.

2. The distributed feedback semiconductor laser of claim 1, further comprising:

first and second upper electrodes electrically isolated from each other and arranged on the second clad layer; and a lower electrode under the semiconductor substrate.

3. The distributed feedback semiconductor laser of claim 2, further comprising:

a first reflective layer formed on an exposed side of the laser oscillation section, for preventing reflection of incident light; and a second reflective layer formed on an exposed side of the laser amplification section to have a predetermined reflectance.

4. The distributed feedback semiconductor laser according to claim 1, wherein the oscillating active layer is formed of one of InGaAs and InGaAsP.

5. The distributed feedback semiconductor laser according to claim 2, wherein the first and second upper electrodes are formed of one of Ti, Pt, and Al.

6. The distributed feedback semiconductor laser according to claim 2, wherein the lower electrode is formed of one of AuGe, Ni, and Au.

7. The distributed feedback semiconductor laser according to claim 1, wherein a thickness of the oscillating active layer is approximately equal to a thickness of the amplifying active layer.

8. The distributed feedback semiconductor laser according to claim 3, wherein the first effective layer has an exposed side surface having a value of reflectance approximate to 0.

9. The distributed feedback semiconductor laser according to claim 3, wherein the second reflective layer has an exposed side surface having a value of reflectance greater than zero.

10. A method for making a distributed feedback semiconductor laser comprising the steps of:

(a) providing a semiconductor substrate;

(b) arranging first and second clad layers on the semiconductor substrate, said first and second clad layers having predetermined refractive indexes;

(c) arranging a guide layer between the first and second clad layers, for propagating light;

(d) arranging an oscillating active layer between the second clad layer and the guide layer, for oscillating light at a predetermined wavelength; and (e) arranging an amplifying active layer between the second clad layer and the guide layer, for amplifying the light with a predetermined gain, wherein a laser oscillation section comprises a predetermined portion of the distributed feedback semiconductor laser including the oscillating active layer, and a laser amplification section comprises a remaining portion of the distributed feedback semiconductor laser including the amplifying active layer, (f) forming first gratings on a lower surface of the guide layer in the laser oscillation section;

(g) forming second gratings on a lower surface of the guide layer in the laser amplification section;

wherein a period of the first gratings formed in step (f) is longer than a period of the second gratings form in step (g) and a gain wavelength of the amplifying active layer is approximate to a distributed feedback wavelength of the first gratings.

11. The method according to claim 10, further comprising:

(h) arranging first and second upper electrodes electrically isolated from each other on the second clad layer; and (i) arranging a lower electrode under the semiconductor substrate.

12. The method according to claim 11, further comprising:

(j) forming a first effective layer on an exposed side of the laser oscillation section, for preventing reflection of incident light; and (k) forming a second reflective layer on an exposed side of the laser amplification section to have a predetermined reflectance.

13. The method according to claim 10, wherein the oscillating active layer in step (d) is formed of one of InGaAs and InGaAsP.

14. The method according to claim 11, wherein the first and second upper electrodes in step (h) are formed of one of Ti, Pt, and Al.

15. The method according to claim 11, wherein the lower electrode in step (i) is formed of one of AuGe, Ni, and Au.

16. The method according to claim 10, wherein a thickness of the oscillating active layer arranged in step (d) is approximately equal to a thickness of the amplifying active layer arranged in step (e).

17. The method according to claim 12, wherein the first reflective layer in step (j) has an exposed side surface having a value of reflectance approximate to 0.

18. The method according to claim 12, wherein the second reflective layer in step (k) has an exposed side surface having a value of reflectance greater than zero.

19. A distributed feedback semiconductor laser comprising:

a semiconductor substrate;

first and second clad layers formed on the semiconductor substrate, said first and second clad layers having predetermined refractive indexes;

a guide layer arranged between the first and second clad layers, for propagating light;

an oscillating active layer arranged between the second clad layer and the guide layer, for oscillating light a predetermined wavelength; and an amplifying active layer between the second clad layer and the guide layer, for amplifying the light with a redetermined gain, wherein a laser oscillation section comprises a predetermined portion of the distributed feedback semiconductor laser including the oscillating a active layer, and a laser amplification section comprises a remaining portion of the distributed feedback semiconductor laser including the amplifying active layer, wherein first gratings are formed on a lower surface of the guide layer in the laser oscillation section;

wherein second ratings are formed on a lower surface of the guide layer in the laser amplification section; and wherein the first gratings have a period that determines a first distributed feedback wavelength, the amplifying active layer being configured with a gain wavelength at which a gain peak value is observed, the gain wavelength being approximately equal to the first distributed feedback wavelength.

* * * * *